(12) United States Patent
Kanemoto et al.

(10) Patent No.: US 6,181,720 B1
(45) Date of Patent: Jan. 30, 2001

(54) SEMICONDUCTOR LASER DEVICE AND METHOD FOR MANUFACTURING SAME

(75) Inventors: Mitsunori Kanemoto; Seiji Kawata, both of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/008,511

(22) Filed: Jan. 16, 1998

(30) Foreign Application Priority Data

Jan. 16, 1997 (JP) .................................................. 9-005489

(51) Int. Cl.⁷ .......................................................... H01S 5/00
(52) U.S. Cl. .................................................. 372/43; 372/36
(58) Field of Search ........................ 372/43, 36; 257/675, 257/791

(56) References Cited

U.S. PATENT DOCUMENTS

| | | | |
|---|---|---|---|
| 5,485,479 | 1/1996 | Kitamura et al. ...................... | 372/43 |
| 5,590,144 | * 12/1996 | Kitamura et al. ..................... | 257/675 |

FOREIGN PATENT DOCUMENTS

| | | |
|---|---|---|
| 61-042969 | 3/1986 | (JP) . |
| 62-058066 | 4/1987 | (JP) . |
| 62-071289 | 4/1987 | (JP) . |
| 63-062257 | 3/1988 | (JP) . |
| 63-167766 | 11/1988 | (JP) . |
| 63-180962 | 11/1988 | (JP) . |
| 2-054263 | 4/1990 | (JP) . |
| 2-191389 | 7/1990 | (JP) . |
| 4-207091 | 7/1992 | (JP) . |
| 4-121768 | 10/1992 | (JP) . |
| 4-346281 | 12/1992 | (JP) . |
| 7-170019 | 7/1995 | (JP) . |

* cited by examiner

*Primary Examiner*—Teresa M. Arroyo
*Assistant Examiner*—Quyen P. Leung
(74) *Attorney, Agent, or Firm*—Foley & Lardner

(57) ABSTRACT

The present invention discloses a semiconductor laser device having: a lead frame; a resin molding provided for sealing a part of said lead frame and including a main body and a flange portion having opposite end faces, said resin molding being formed into such a shape that said flange portion protrudes outwardly from a periphery of said main body; a laser chip having an optical axis and mounted on a surface of said lead frame for emitting laser light; and a heat-radiating fin provided on said lead frame for cooling said laser chip, said heat-radiating fin being disposed in an exposed state on the side of at least one of said two end faces of said flange portion.

13 Claims, 14 Drawing Sheets

FIG.3
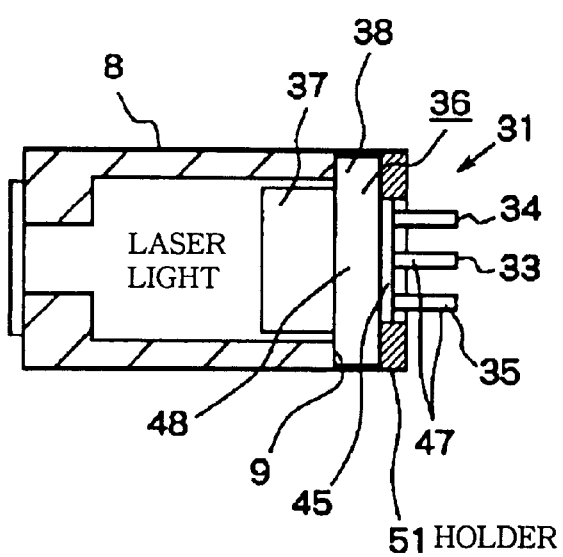
(a)
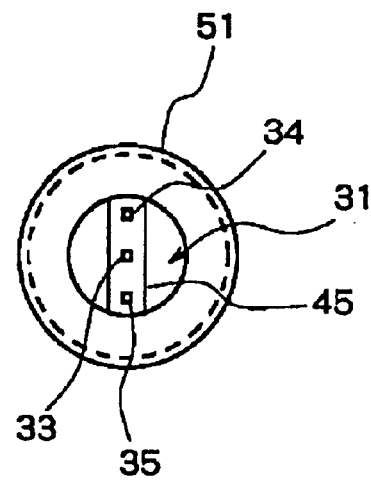
(b)

FIG.6
(a) 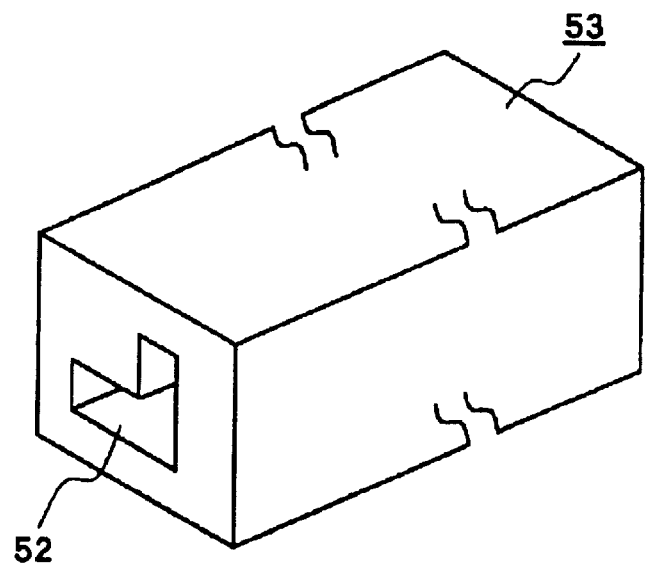
(b) 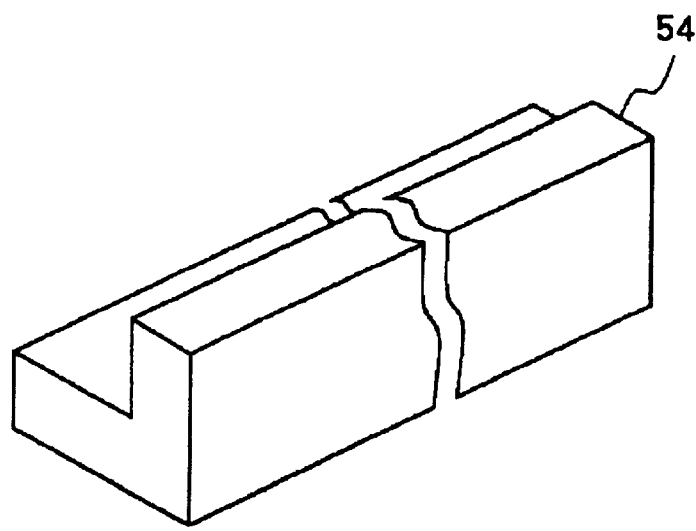
(c) 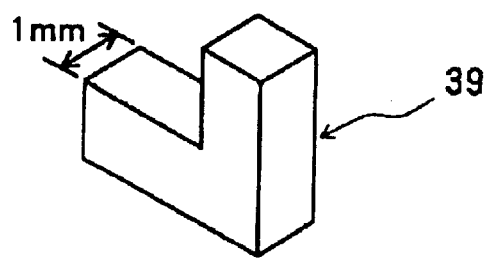

SEMICONDUCTOR LASER DEVICE AND METHOD FOR MANUFACTURING SAME

BACKGROUND OF THE INVENTION

1. Field of the Invention

The present invention relates to a resin molding type of semiconductor laser device, and to a method for manufacturing the same.

2. Description of the Related Art

Semiconductor laser devices have been utilized in the past for optical disk players, laser printers, and other such optical response devices. Semiconductor laser devices come in can types and resin molding types, for example, with a laser chip mounted to a frame.

As shown in FIG. 13, a can type of semiconductor laser device 1 comprises a laser chip 2 that emits laser light, and this laser chip 2 is mounted on the side of a rectangular heat-radiating body 3 that is parallel to the optical axis. This heat-radiating body 3 is erected on the top of a disk-shaped stem 4, and a cylindrical cap 5 is mounted around its periphery. A glass window is provided to the top of the cap 5, and the laser chip 2 faces the glass window 6 from the inside of the cap 5. Because the outside diameter of the stem 4 is larger than that of the cap 5, the outer periphery of the stem 4 that sticks out further than this cap 5 becomes a flange 7.

With the can type of semiconductor laser device 1 described above, when the laser chip 2 inside the cap 5 emits laser light, this laser light is emitted through the glass window 6. The laser chip 2 generates heat at this time, but because the inside of the cap 5 is hollow, this heat is radiated by the stem 4, which acts as a heat-radiating fin.

With the can type of semiconductor laser device 1 described above, since in structural terms the laser chip 2 is fixed with good precision to the stem 4, as shown in FIG. 14, laser light can generally be emitted accurately with respect to a device housing 8 if the shape of the flange 7 is utilized for mounting in a stepped hole 9 of the device housing 8.

However, the can type of semiconductor laser device 1 comprises numerous parts and has a complicated construction. In view of this, a semiconductor laser device in which the laser chip is sealed with a resin molding has been developed in an effort to simplify the construction and improve productivity.

For instance, as shown in FIG. 15, the resin molding type of semiconductor laser device 11 disclosed in Japanese Laid-Open Patent Application No. Hei7-170019 has the laser chip 2 mounted to a lead frame 13 via a sub-mount layer 12, and the laser chip 2 is sealed along with the upper portion of this lead frame 13 by a transparent resin molding 14. Furthermore, this resin molding 14 is formed in the same shape as in the above-mentioned can type, so interchangeability is ensured so that mounting to the device housing 8 can be performed just as with a can type.

As shown in FIG. 16, the resin molding type of semiconductor laser device 21 disclosed in Japanese Laid-Open Utility Model Application No. Hei2-54263 has a convex component 23 that serves as a heat-radiating fin formed on both sides of a lead frame 22, and these convex components 23 protrude to the outside of a resin molding 24, which enhances the heat radiation of the laser chip 2 sealed by the resin. The resin molding type of semiconductor laser devices 11 and 21 discussed above offer a simple construction and good productivity.

However, although interchangeability is good with the semiconductor laser device 11 in Japanese Laid-Open Patent Application No. Hei7-170019 because the resin molding 14 is formed in the same shape as that of a can type, the thermal radiation of the laser chip 2 sealed by this resin molding 14 is difficult. Furthermore, with the semiconductor laser device 11, the lead frame 13 to which the laser chip 2 is fixed is inserted into the resin molding 14, but it is difficult to position the lead frame 13 accurately with respect to this resin molding 14. Accordingly, the positioning precision of the laser chip 2 with respect to the resin molding 14 is low, and it is difficult to direct the laser light at the proper location when the semiconductor laser device is mounted in the device housing 8 at the resin molding 14 portion.

In contrast, since convex components 23 that serve as heat-radiating fins are formed on the lead frame 22 with the semiconductor laser device 21 discussed in Japanese Laid-Open Utility Model Application No. Hei2-54363, the heat generated by the laser chip 2 can be eliminated very well, and the lead frame 22 can be inserted at the proper location with respect to the resin molding 24 by means of these convex components 23. However, since the convex components 23 of the lead frame 22 stick out on both sides of the resin molding 24, it is difficult for the shape thereof to be formed the same as that of a can type and thereby ensure interchangeability.

Also, with the resin molding type of semiconductor laser devices 11 and 21 discussed above, the laser chip 2 is also sealed with the resin moldings 14 and 24 along with the lead frames 13 and 22, but this is undesirable since the laser chip 2 is subjected to high temperature and pressure during the molding of the resin moldings 14 and 24 with this configuration, and there is the possibility of breakage.

SUMMARY OF THE INVENTION

It is therefore an object of the present invention to provide a resin molding type of semiconductor laser device with which interchangeability with a conventional can type is ensured, while the thermal radiation of the laser chip is also good, the positioning precision of the laser light is high, and there is no danger of breakage in the laser chip during molding.

In order to achieve the above-mentioned object, according to a first aspect of the present invention, there is provided a semiconductor laser device in which a laser chip that emits laser light is mounted on the surface of a lead frame that is parallel to the optical axis, and part of the lead frame is sealed with a resin molding having a main body, wherein the semiconductor laser device is such that the resin molding is formed in a shape such that a flange protrudes from around the outside at the end of this main body, a heat-radiating fin for cooling the laser chip is provided to the lead frame, and the heat-radiating fin is exposed on the side of at least one of the two end faces of the flange.

Therefore, according to the above-mentioned first aspect, heat generated by the laser chip can be eliminated favorably since a heat-radiating fin for cooling the laser chip is provided to the lead frame, and this heat-radiating fin is exposed on the side of at least one of the two end faces of the flange of the resin molding. With this configuration, the resin molding is shaped roughly the same as in a conventional can type, so interchangeability with a conventional can type is ensured. Furthermore, since the lead frame can be positioned in the cavity of the metal mold by the heat-radiating fin when the resin molding is molded, there is an improvement in the precision of the relative positions of the optical axis of the laser chip and the shape of the resin molding.

In the above-mentioned first aspect, the laser chip can be sealed if a separate resin cap is mounted to the resin molding, so the laser chip can be protected favorably against humidity and the like in the external atmosphere. It is also preferable to provide the heat-radiating fin to the back side of the lead frame. When mounting to the device housing is taken into account, it is preferable for the heat-radiating fin to be exposed on the side of at least one of the two end faces of the flange and in roughly the same plane as the end face corresponding to the flange.

The lead frame and the heat-radiating fin may also be formed integrally. The heat-radiating fin may also consist of a plurality of parts.

If a wiring lead frame is provided to the side of the lead frame on which the laser chip is mounted, and a convex component is provided at a location on the rear end face of the resin molding where the lead frame protrudes, then when metal parts are arranged around the lead frame during the mounting of the resin molding to the device, short circuits between these metal parts and the lead frame can be prevented.

According to a second aspect of the present invention, there is provided a method for manufacturing a semiconductor laser device, in which a laser chip that emits laser light is mounted on the surface of a lead frame that is parallel to the optical axis, a heat-radiating fin for cooling the laser chip is provided to the lead frame, and part of the lead frame is sealed with a resin molding having a main body, wherein this method for manufacturing a semiconductor laser device is such that, first, part of the lead frame having the heat-radiating fin is sealed with the resin molding, after which the laser chip is mounted at a specific site on the lead frame where there has been no sealing with the resin molding.

Therefore, according to this second aspect, the semiconductor laser device according to the above-mentioned first aspect can be manufactured with good precision. Specifically, since the laser chip can be mounted to the lead frame after the resin molding has been injection molded, the laser chip is not subjected to the high temperature and pressure entailed during injection molding. Therefore, deterioration and breakage of the laser chip can be prevented.

Since the laser chip can be sealed if a separate resin cap is mounted to the resin molding, the laser chip can be protected favorably against humidity and the like in the external atmosphere.

BRIEF DESCRIPTION OF THE DRAWINGS

The above and other objects, advantages and features of the present invention will be more apparent from the following description taken in conjunction with the accompanying drawings in which:

FIGS. 3a and 3b constitute a two-view diagram of the state in which the semiconductor laser device has been attached to the device housing, with FIG. 3a being a cross sectional view, and FIG. 3b a rear view;

FIGS. 6a–6c are step diagrams illustrating the method for manufacturing the heat-radiating fin used in the semiconductor laser device in one embodiment of the present invention;

DESCRIPTION OF THE PREFERRED EMBODIMENTS

Preferred embodiments of the present invention will now be described through reference to the figures.

In these embodiments, the same names and numbers will be used to refer to those structural components that are the same as in the conventional semiconductor laser device discussed above.

Figure 1:
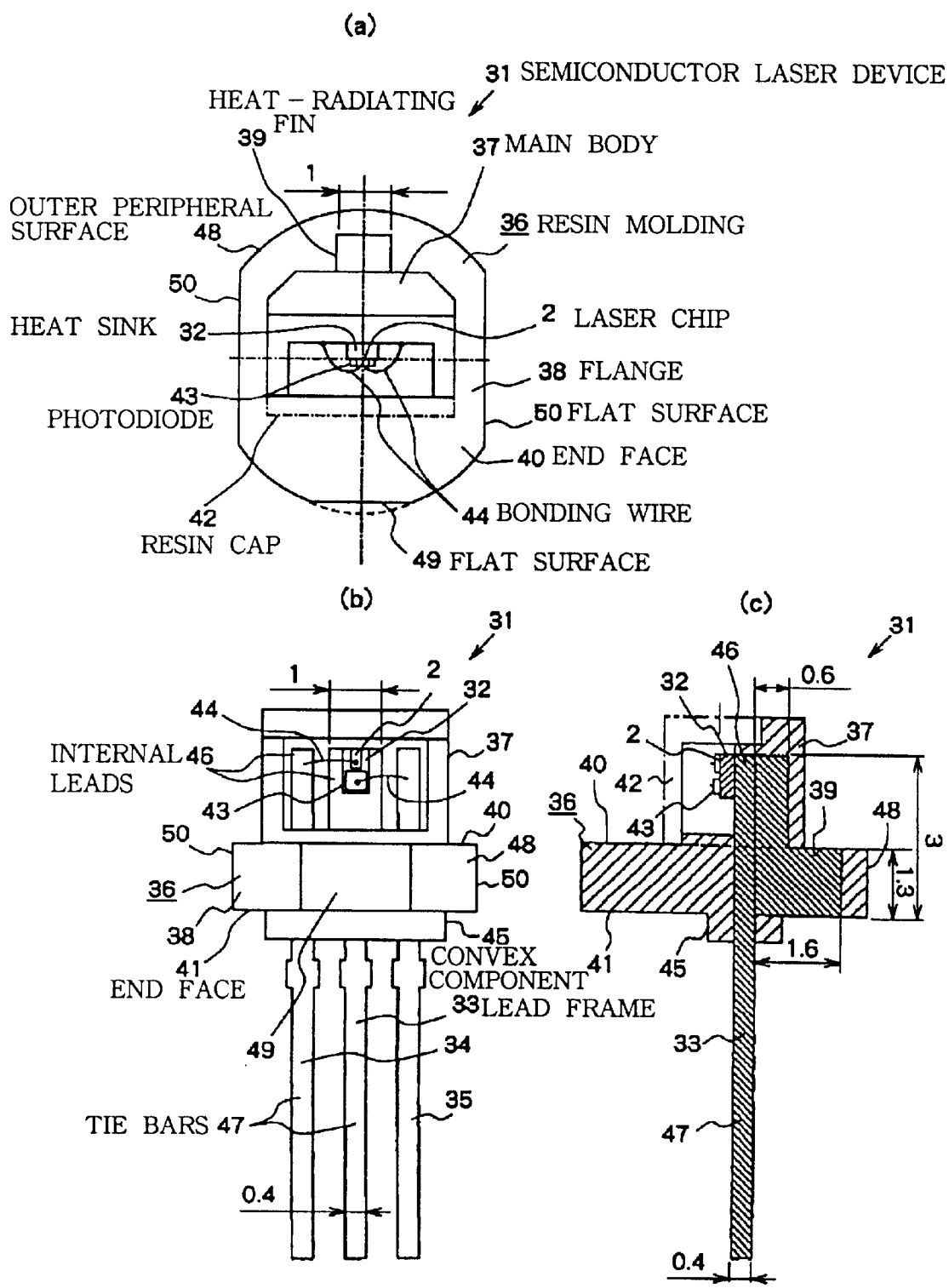
FIG. 1a to 1c constitute a three-view diagram of the structure of the semiconductor laser device in one embodiment of the present invention, with FIG. 1a being a plan view, FIG. 1b being a front view, and FIG. 1c being a cross sectional view.

First, with the semiconductor laser device 31 in this embodiment, as shown in FIG. 1, the laser chip 2 is mounted to the surface of a lead frame 33 parallel to the optical axis via a heat sink 32. This lead frame 33 is sealed with a resin molding 36 along with wiring lead frames 34 and 35.

This resin molding 36 is formed in a shape such that a flange 38 sticks out around the outside at the end of the main body 37, and is formed in the same shape as the so-called can type of semiconductor laser device 1. A separate L-shaped heat-radiating fin 39 is integrally mounted on the rear side of the lead frame 33, and this heat-radiating fin 39 is sealed with the resin molding 36 in a state in which it is exposed on both of the end faces 40 and 41 of the flange 38.

Figure 2:
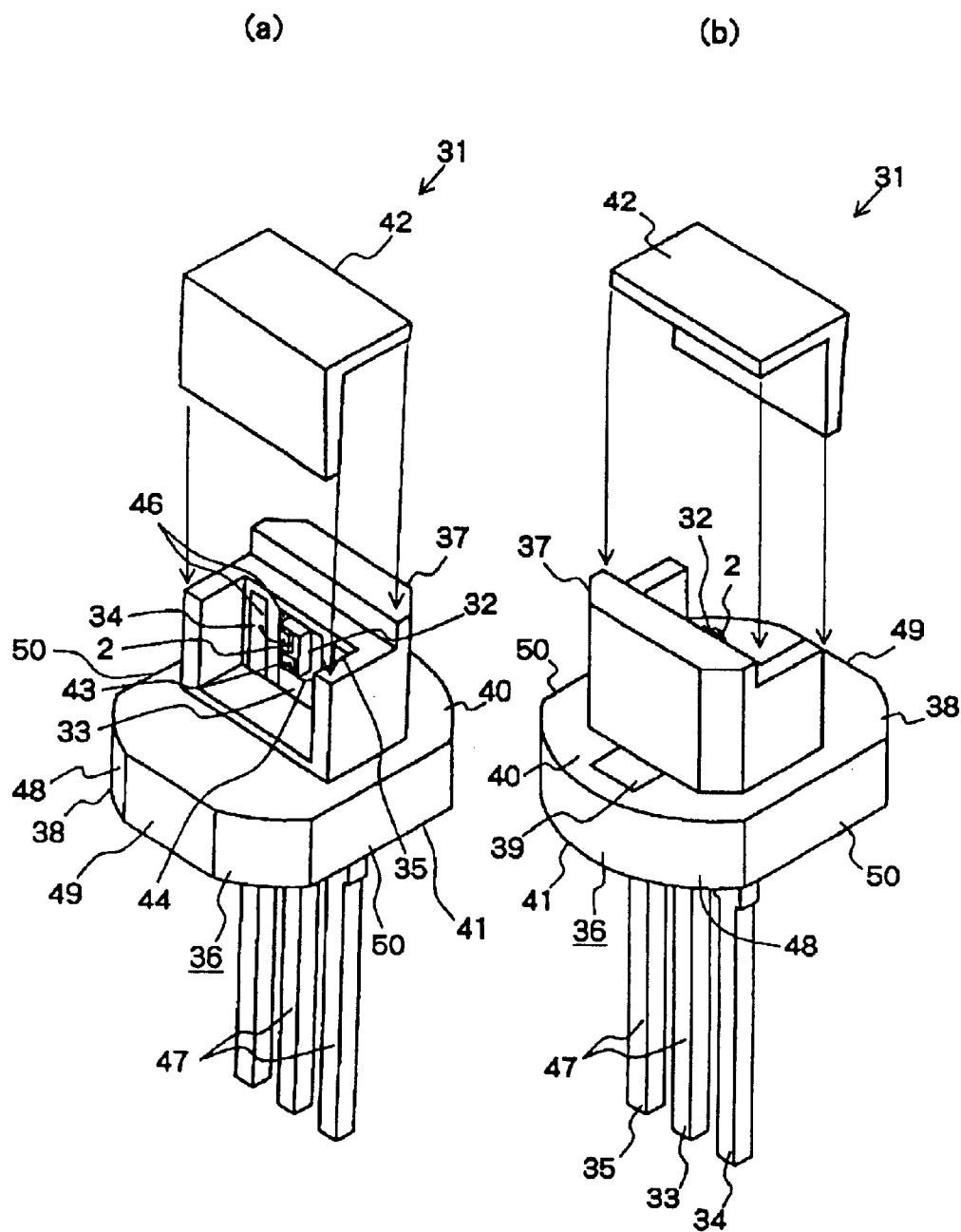
FIGS. 2a and 2b are exploded oblique views of the structure of the semiconductor laser device.

As shown in FIG. 2, this resin molding 36 is formed here in a shape such that the laser chip 2 is exposed, and a separate resin cap 42 is integrally mounted here, which seals the laser chip 2. The resin cap 42 is formed from a colorless, transparent, acrylic or epoxy resin that transmits laser light well, and is formed in an L shape such that the two flat panels are joined at a right angle. The location where the laser light is transmitted is covered with an AR coating as a surface treatment for increasing transmissivity.

A photodiode 43 is mounted to the rear (in the optical axis direction) of the laser chip 2, and this photodiode 43 and the laser chip 2 are wired to the lead frames 34 and 35, respectively. The resin molding 36 has a convex component 45 formed on its rear end face 41, and the lead frames 32 to 34 protrude from the location of this convex component 45. The portions of the lead frames 32 to 34 located inside the resin molding 36 are called inner leads 46, and the portions of the lead frames 32 to 34 protruding from the resin molding 36 are called tie bars 47.

The flange 38 of the resin molding 36 is formed such that the outer peripheral surface thereof is cylindrical and concentric with the optical axis of the laser chip 2, but a single flat surface 49 that is parallel to the surface of the lead frame 33, and a pair of flat surfaces 50 that are perpendicular to the surface of the lead frame 33 are formed as parts of this flange 38.

With the structure described above, since the semiconductor laser device 31 in this embodiment is equivalent to a conventional can type in terms of the shape of the resin molding 36, mounting to the device housing 8 is possible in the same manner as with a conventional can type, as shown in FIG. 3.

The semiconductor laser device 31 in this embodiment has the heat-radiating fin 39 provided to the rear face of the lead frame 33, which has the laser chip 2 mounted on the front side, and the heat-radiating fin 39 is exposed on both of the end faces of the flange 38 of the resin molding 36, so the heat generated by the laser chip 2 is radiated well and the laser light can be emitted more stably. In particular, when the metal device housing 8, a holder 51, or the like touches the end face of the flange 38, the heat-radiating fin 39 comes into contact with these, which makes possible the favorable radiation of the heat generated by the laser chip 2.

Figure 4:
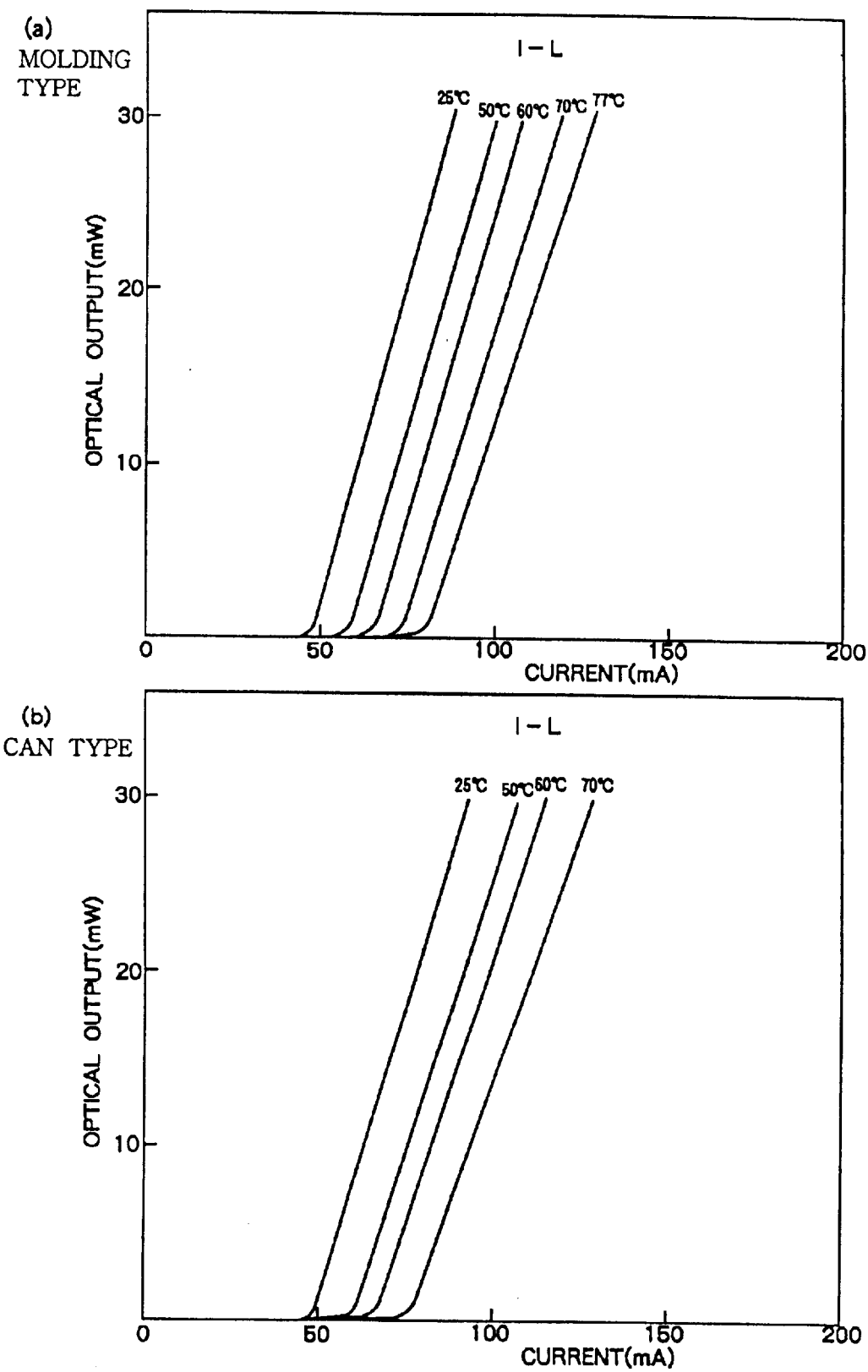
FIG. 4a is a graph of the optical output characteristics of the semiconductor laser device in one embodiment of the present invention.
FIG. 4b is a graph of the optical output characteristics of a conventional can type of semiconductor laser device.

In view of this, a prototype of the semiconductor laser device 31 discussed above was actually produced, and a test was conducted for thermal radiation along with the conventional can type of semiconductor laser device 1, whereupon, as shown in FIG. 4, it was confirmed that the semiconductor laser device 31 of this embodiment allows for thermal radiation equivalent to that of a conventional can type, despite its being a resin molding type.

The details of this test will now be described. First, the semiconductor laser devices 1 and 31 were each installed in an aluminum block, and the aluminum block was placed on a hot plate (not shown). Here, with the semiconductor laser device 31, the heat-radiating fin 39 was in contact with the aluminum block. The aluminum block was then heated by the hot plate to 25° C., 50° C., 60° C., 70° C., and 77° C., a current was applied to the semiconductor laser devices 1 and 31 in each of these states, and the current was raised until the output of laser light from each device reached the specified approximately 30 mW. It was confirmed that with both of the semiconductor laser devices 1 and 31, a large current was required to generate the specified optical output at high temperatures, and at a small current a high degree of thermal radiation was required in order to output laser light at a high level of efficiency. Graphs of the relationship between optical output and current value for the semiconductor laser devices 1 and 31 at the various temperatures were compared, whereupon it was confirmed that these relationships were equivalent, as shown in FIGS. 4a and 4b.

In other words, the semiconductor laser device 31 in this embodiment, despite being a resin molding type, is capable of thermal radiation that is equivalent to that of the conventional can type of semiconductor laser device 1. This means that the heat generated by the laser chip 2 is conducted favorably to the aluminum block by the heat-radiating fin 39.

Furthermore, as mentioned above, the semiconductor laser device 31 in this embodiment is mounted with the flange 38 of the resin molding 36 in the stepped hole 9 of the device housing 8, but because of the high precision in the relative positioning of the laser chip 2 and the shape of this flange 38, the laser light can be emitted more accurately with respect to the device housing 8. In other words, when the 36 is formed, the lead frame 33, on the front of which is mounted the laser chip 2, can be positioned by means of the heat-radiating fin 39 on the rear side, so the laser chip 2 can be put in the proper position with respect to the shape of the resin molding 36 (this will be discussed in more detail below).

In particular, since the outer peripheral surface 48 of the flange 38 is formed as a cylinder that is concentric with the optical axis of the laser chip 2, if the semiconductor laser device 31 is mounted in the device housing 8 with the flange 38 just as with a conventional can type, then the laser light of the laser chip 2 can be emitted to the same location as with a conventional can type, and there is no need to set the angle during mounting.

Since a pair of flat surfaces 50 that are parallel to each other are formed on the outer peripheral surface 48 of the flange 38 of the resin molding 36, an assembly manipulator (not shown), for example, can easily hold the resin molding 36 at the location of the flat surfaces 50, which allows the work of attaching the resin cap 42 to the resin molding 36, or the work of attaching the semiconductor laser device 31 to the device housing 8, to be carried out more efficiently. Furthermore, since these flat surfaces 50 are formed in the direction perpendicular to the front of the lead frame 33, it is easier to take the injection-molded resin molding 36 out of the metal mold, as will be described in more detail below.

Also, when the semiconductor laser device 31 in this embodiment is fixed to the device housing 8 with the annular holder 51 as shown in FIG. 3, since a convex component 45 is formed on the rear end face 41 of the 36 at the location where the lead frames 33 to 35 stick out, there will be no short circuiting of the lead frames 33 to 35 even if the holder 51 is made of metal. In addition, with the semiconductor laser device 31 of the above structure, since the heat-radiating fin 39 is exposed on both sides of the flange 38 of the resin molding 36, the heat-radiating fin 39 can be brought into contact with both the device housing 8 and the holder 51, and extremely good thermal radiation will be displayed.

Figure 5:
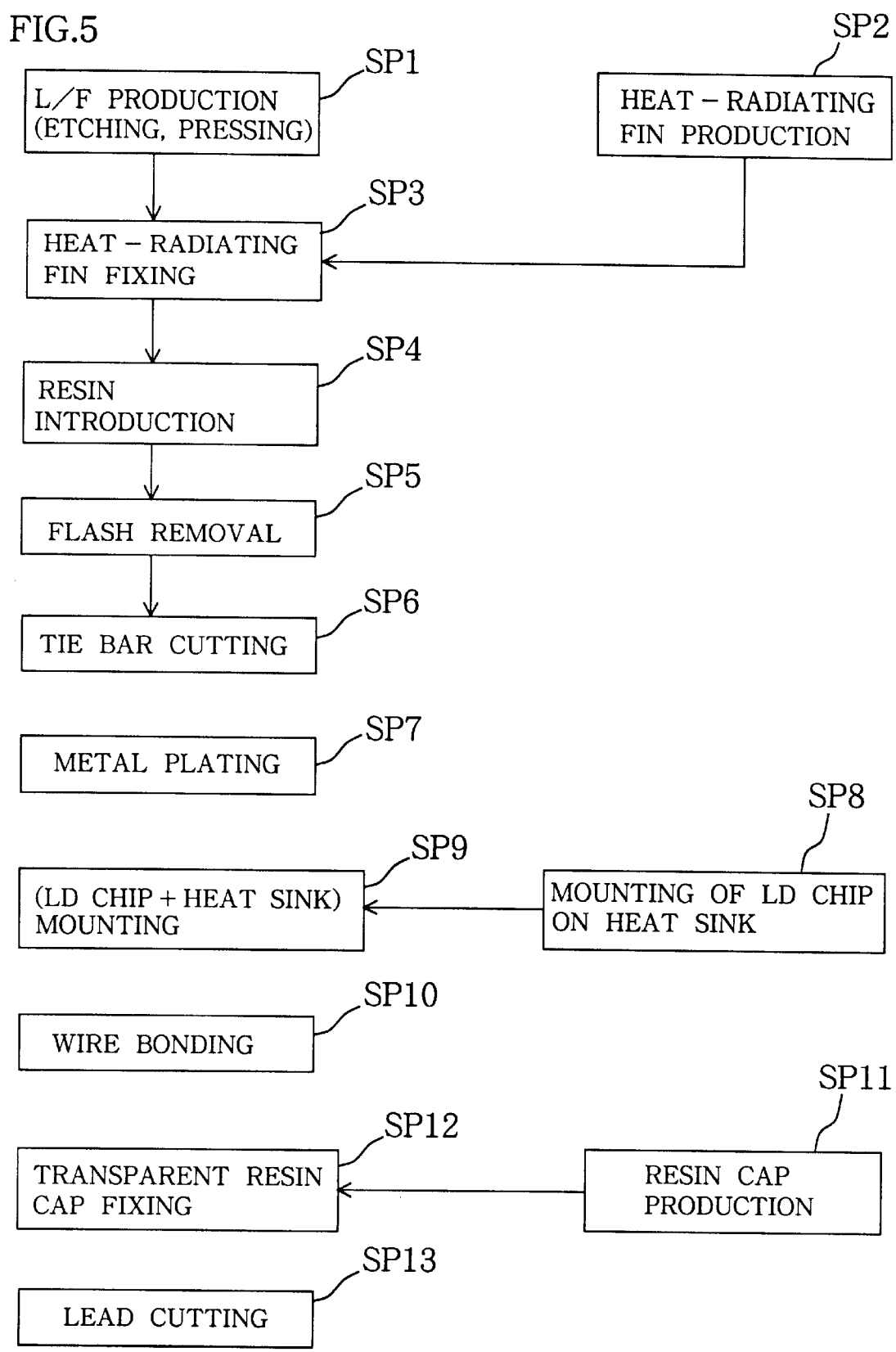
FIG. 5 is a flow chart of the semiconductor laser device manufacturing method in one embodiment of the present invention.

Next, the method for manufacturing the semiconductor laser device 1 with the structure described above will be described through reference to FIGS. 5 to 10. First, as shown by step SP1 in FIG. 5, the lead frames 33 to 35 and the heat-radiating fin 39 are produced individually. For instance, three lead frames 33 to 35 are formed by the etching or pressing of thin metal sheets, at the location of the tie bars 47, initially in a state of being integrally linked to each other.

Because the heat-radiating fin 39 is so thick, it is difficult to produce by the etching or pressing of a metal sheet, so it is produced by drawing, for example (step SP2). In this case, as shown in FIG. 6a, a metal mold 53, in which an L-shaped opening 52 has been formed corresponding to the heat-radiating fin 39, is readied for drawing, and as shown in FIG. 6b, a member 54 having an L-shaped cross section is formed by drawing in this metal mold 53, and as shown in FIG. 6c, this member 54 is cut to a thickness of about 1.0 mm. This allows a large number of heat-radiating fins 39 to be produced with ease.

Figure 7:
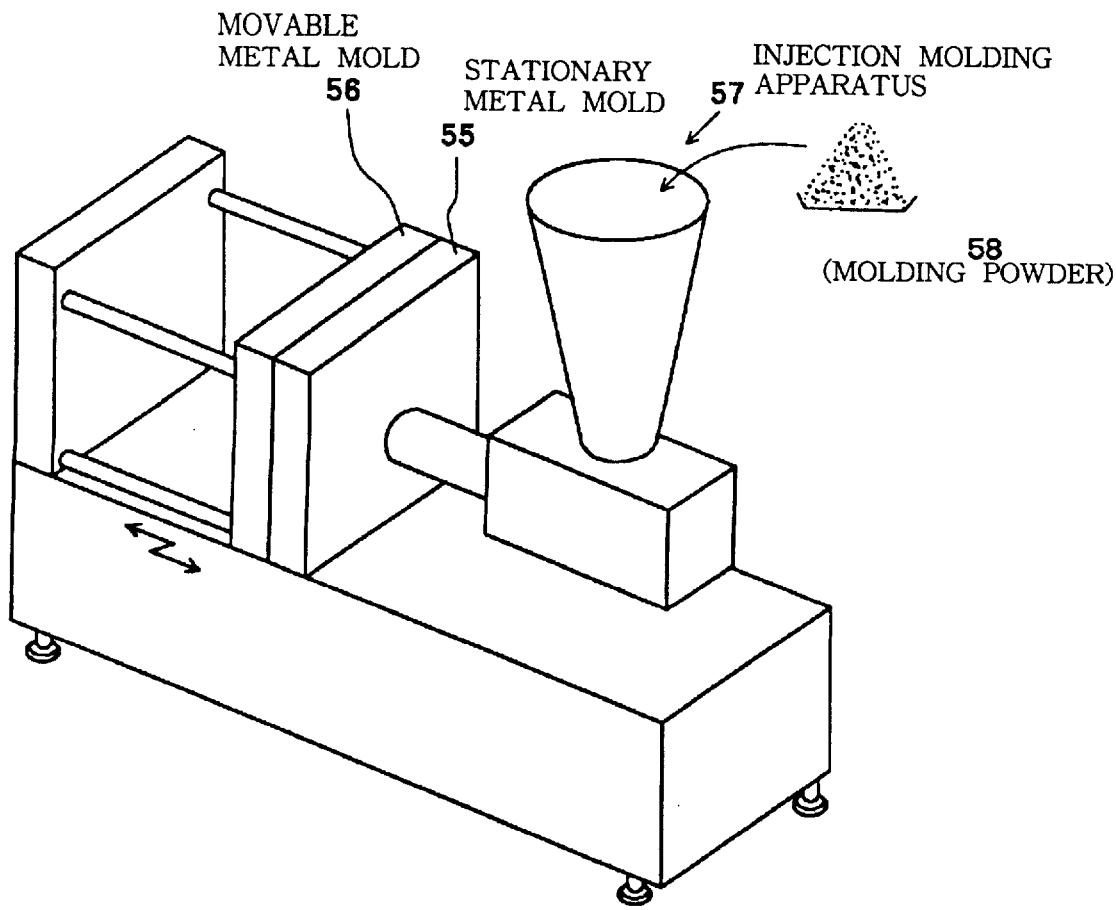
FIG. 7 is an oblique view of the injection molding apparatus used to form the resin molding in the semiconductor laser device in one embodiment of the present invention.
Figure 8:
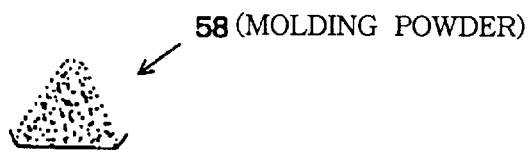
FIG. 8 is a schematic diagram of the resin powder that serves as the material of the resin molding.

The heat-radiating fin 39 produced in this manner is fixed with an adhesive having good thermal conductivity, such as silver paste, to the rear of the lead frame 33, to which the lead frames 34 and 35 have been integrated (step SP3), and this product is sealed with the resin molding 36 (step SP4). In this case, as shown in FIG. 7, a stationary metal mold 55 and a movable metal mold 56 corresponding to the resin molding 36 are readied, and these are set in an injection molding apparatus 57. Next, as shown in FIG. 8, an epoxy (for example) resin powder 58 is readied, and this is fed into the injection molding apparatus 57.

Figure 9:
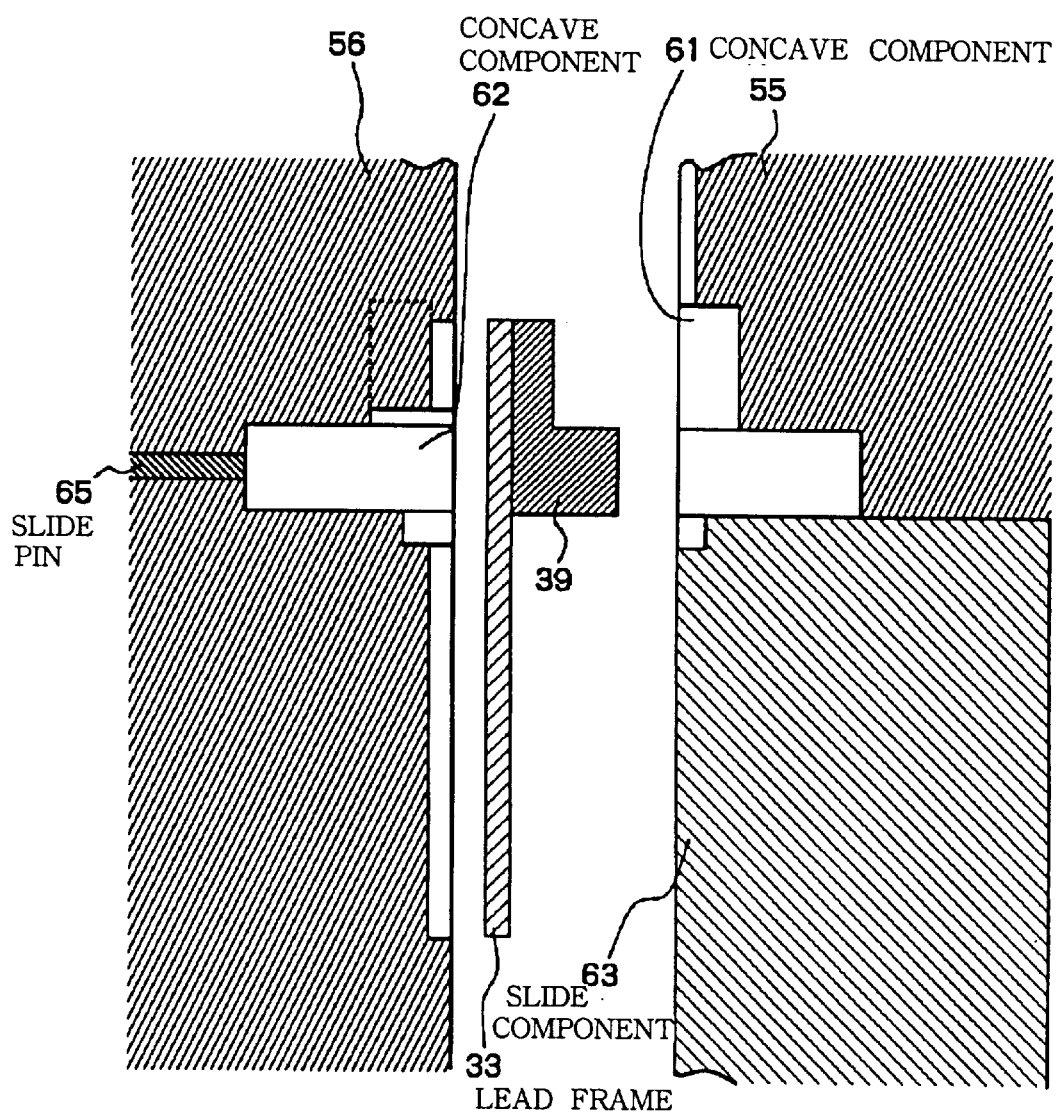
FIG. 9 is a cross sectional view of the structure of the metal mold.
Figure 10:
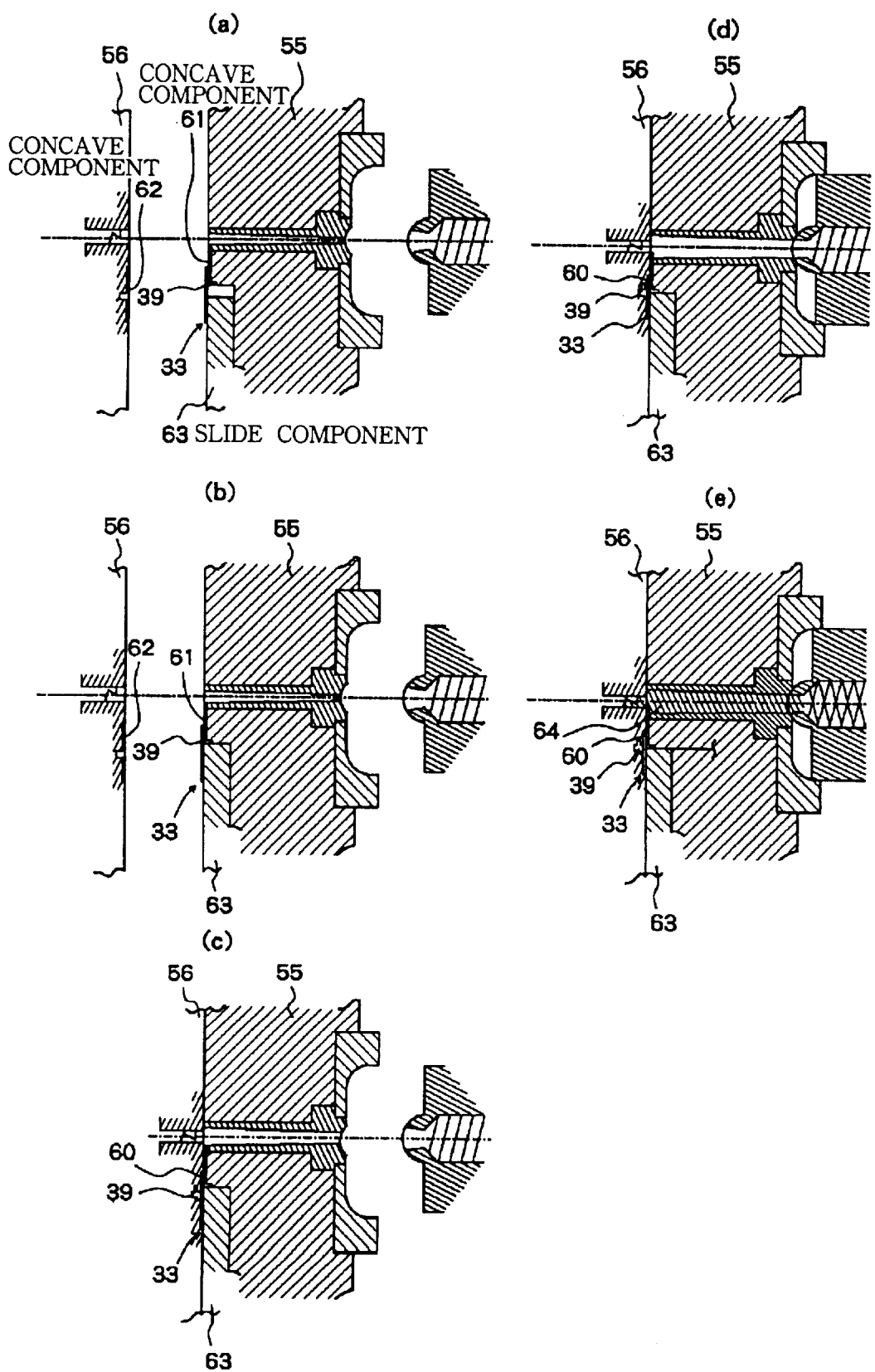
FIGS. 10a–10e are cross sectional views of the step for molding the resin molding.
Figure 11:
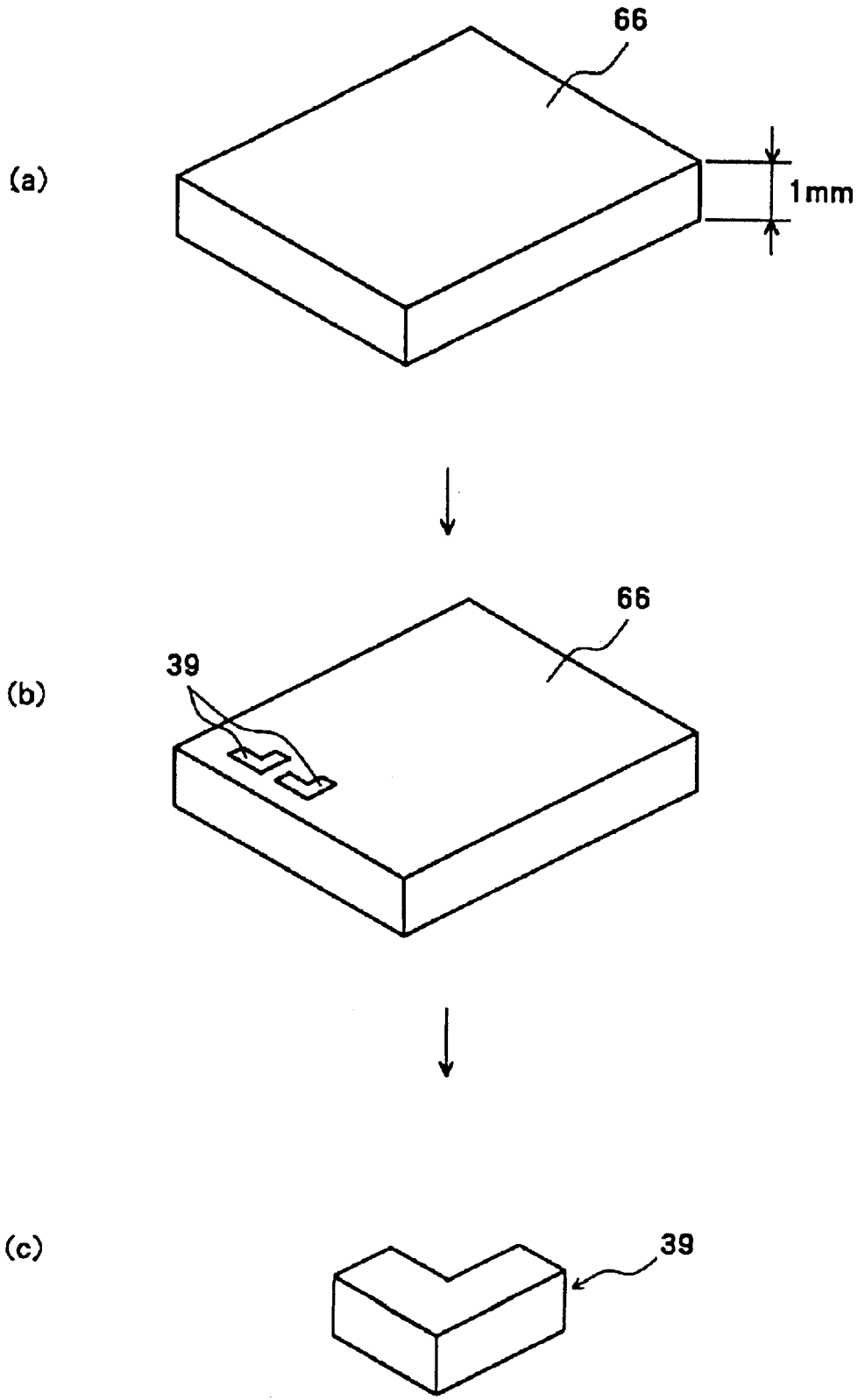
FIGS. 11a–11c are step diagrams illustrating a variation example of the method for manufacturing the heat-radiating fin.

As shown in FIG. 9, concave components 61 and 62 are formed in the metal molds 55 and 56 so as to form a cavity 60 whose shape corresponds to the resin molding 36. In particular, the stationary metal mold 55 has a slide component 63 formed at a location that closes off the concave component 62. The concave component 62 of the stationary metal mold 55 is formed such that the heat-radiating fin 39 is held at the location closed off by the slide component 63, so, as shown in FIGS. 10a and 10b, the lead frames 33 to 35 are positioned by the heat-radiating fin 39 in the concave component 61 of the stationary metal mold 55 here.

As shown in FIG. 10c, the movable metal mold 56 is joined with the stationary metal mold 55 in this state, and molten resin 64 is injected into the cavity formed by the concave components 61 and 62 of these metal molds 55 and 56 as shown in FIGS. 10d and 10e. As a result, the lead frame 33, to which the heat-radiating fin 39 is fixed, is insert-molded in the resin molding 36 along with the lateral lead frames 34 and 35, and the resin molding 36 is subsequently taken out by separating the movable metal mold 56 from the stationary metal mold 55.

At this point, the resin molding 36 is pushed out of the concave component 61 by a slide pin 65 provided to the movable metal mold 56, but since this slide pin 65 strikes the flat surface 40 of the flange 38 of the resin molding 36, the slide pin does not damage the shape of the resin molding 36. Also, the pair of flat surfaces 50 that are parallel to each other are formed on both sides of the flange 38 of the resin molding 36, but since these flat surfaces 50 are formed parallel to the direction in which the metal molds 55 and 56 are separated, the resin molding 36 can be taken out of the metal molds 55 and 56 with ease. Furthermore, since the lead frames 33 to 35 are accurately positioned inside the cavity 60 of the metal molds 55 and 56 by the heat-radiating fin 39 as discussed above, the resin molding 36 is molded in the proper shape with respect to the position of the front of the lead frame 33.

Since the lead frames 33 to 35 are thus sealed by the resin molding 36 in the molding, the inner leads 46 of the lead frames 33 to 35 are ideally exposed in the inside of the resin molding 36 in this state. However, since resin flash is produced on this surface, the flash is removed in this case as shown in step SP5 in FIG. 5. Next, the tie bars 47 of the lead frames 33 to 35 that stick out from the resin molding 36 are cut off (step SP6), and the inner leads 46 and tie bars 47 of the lead frames 33 to 35 are covered with a metal or other plating layer (step SP7).

The separately readied laser chip 2 and photodiode 43 are mounted on the metal heat sink 32 (step SP8), and this heat sink 32 is fixed to the inner lead 46 of the above-mentioned lead frame 33 with an adhesive that has good electrical and thermal conductivity, such as silver paste (step SP9). Next, the laser chip 2 is wired to the inner lead 46 of the lead frame 33, and the photodiode 43 to the inner lead 46 of the lead frame 35, by ultrasonic fusing or hot press bonding of a metal bonding wire 44 (step SP10).

The resin cap 42 is individually produced by the injection molding of an acrylic or epoxy resin (step SP11), and this resin cap 42 is coated with an AR (anti-reflective) coating as a surface treatment. This resin cap 42 is fixed to the above-mentioned resin molding 36 with a photosetting adhesive or the like (step SP12), and the tie bars 47 of the lead frames 33 to 35 are cut to the required length (step SP13) to complete the semiconductor laser device 31.

Thus, according to the manufacturing method of this embodiment, the laser chip 2 and resin cap 42 are mounted to the lead frame 33 after the injection molding of the resin molding 36, so the laser chip 2 and the like are not subjected to the high temperature and pressure entailed by injection molding, and deterioration and damage of the laser chip 2 and the like can therefore be prevented. Since the laser chip 2 and the photodiode 43 are sealed by mounting the separate resin cap 42 on the resin molding 36, the laser chip 2 and the like can be protected well against humidity and so on in the external atmosphere.

Since this resin cap 42 is formed in a simple L shape, it can be produced easily, and therefore can be fixed accurately to the resin molding 36, so the laser chip 2 and the like can be sealed favorably, and since the portion facing the laser chip 2 is flat, it does not hinder the transmission of laser light. Furthermore, since the resin cap 42 is surface treated with an AR coating that enhances the transmissivity of laser light, the semiconductor laser device 31 is able to emit the laser light more efficiently. Further, since the resin cap 42 is formed from an acrylic or epoxy resin, it can be produced easily using an ordinary resin as the material, and if this material is the same as that of the resin molding 36, then peeling caused by differences in thermal expansion can be prevented.

The present invention is not limited to the above embodiment, and various permutations are possible to the extent that the essence of the invention is not exceeded. For example, in the above embodiment the heat-radiating fin 39 was produced by cutting the member 54 drawn to the specified cross sectional shape in the metal mold 53, but it is also possible to use a wire cutter or laser cutter to cut off the heat-radiating fin 39 from a metal sheet 66 of the specified thickness.

Also, in the above embodiment the heat-radiating fin 39 was produced as a single part, but it is also possible to produce this heat-radiating fin 39 from a plurality of parts. For instance, if the heat-radiating fin 39 has an L-shaped cross section as above, then it can be fabricated by joining long and short sections. When the heat-radiating fin 39 is produced as a single part, and when it is produced as a plurality of parts, the productivity, thermal conductivity, and various other considerations will be mutually conflicting, so the selection should be made after consideration of the required performance and the cost.

In addition, in the above embodiment the lead frame 33 and the heat-radiating fin 39 were formed separately and then integrally joined, but it is also possible for the lead frame and the heat-radiating fin to be formed integrally from the outset. An integral part such as this is not as easy to produce as separate components, but it allows thermal conductivity to be improved, so this selection of structures should also be made after consideration of performance and cost.

Figure 12:
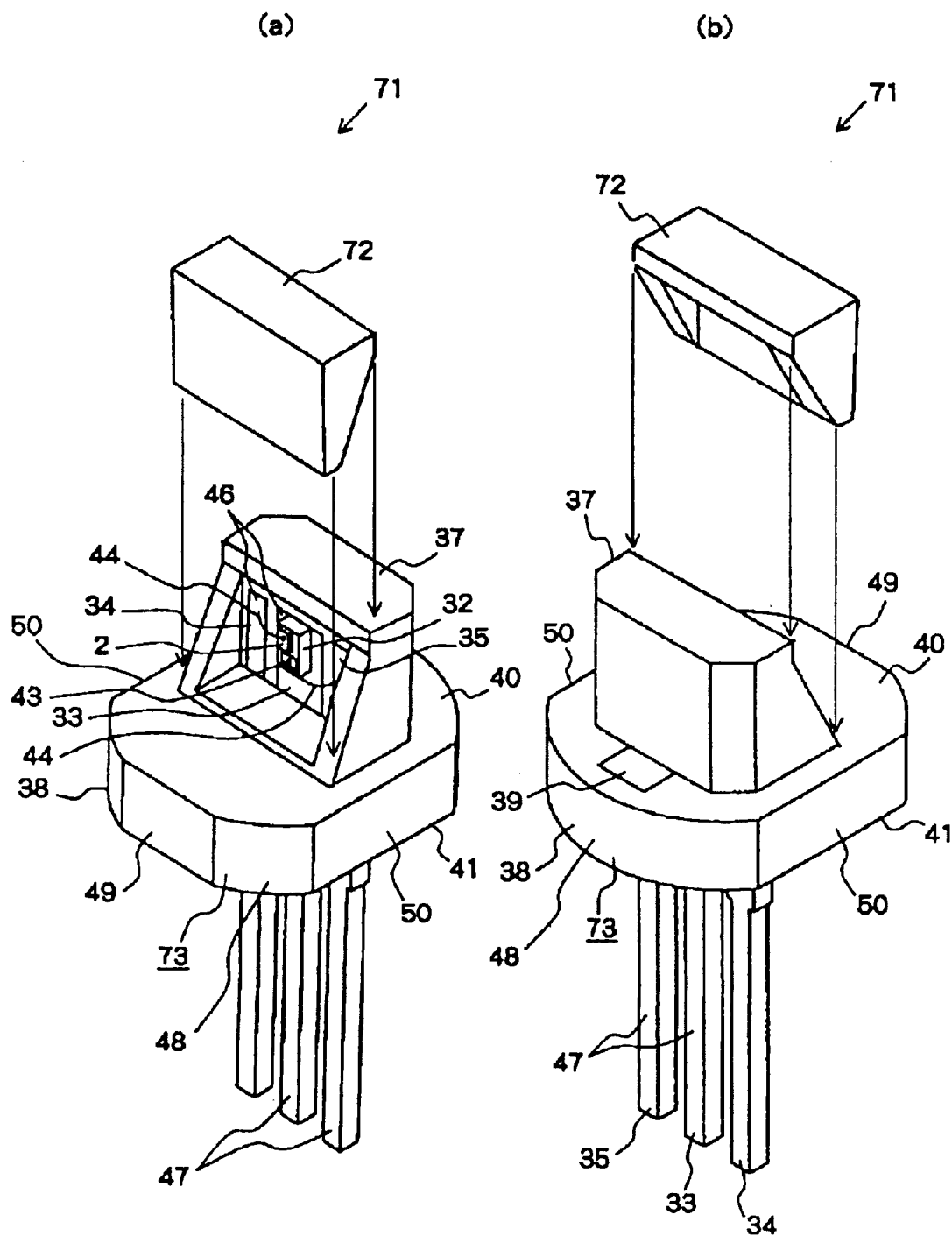
FIGS. 12a–12b are exploded oblique views of the structure of the semiconductor laser device in another embodiment of the present invention.
Figure 13:
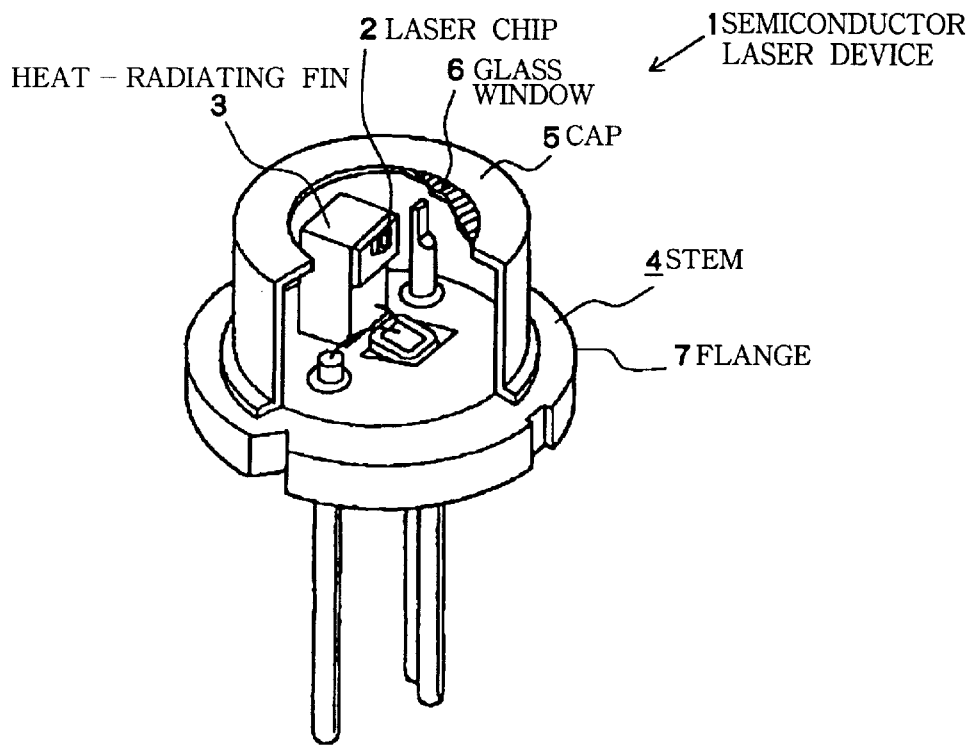
FIG. 13 is an oblique view of the structure of a conventional can type of semiconductor laser device.
Figure 14:
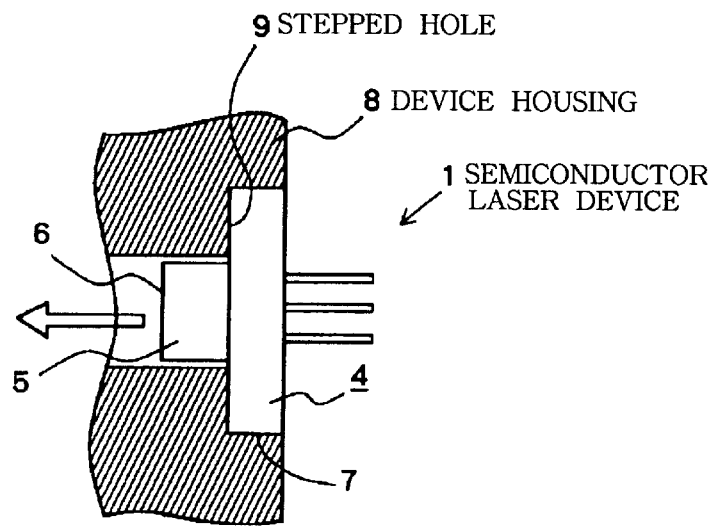
FIG. 14 is a cross section of the state in which this can type of semiconductor laser device has been attached to the device housing.
Figure 15:
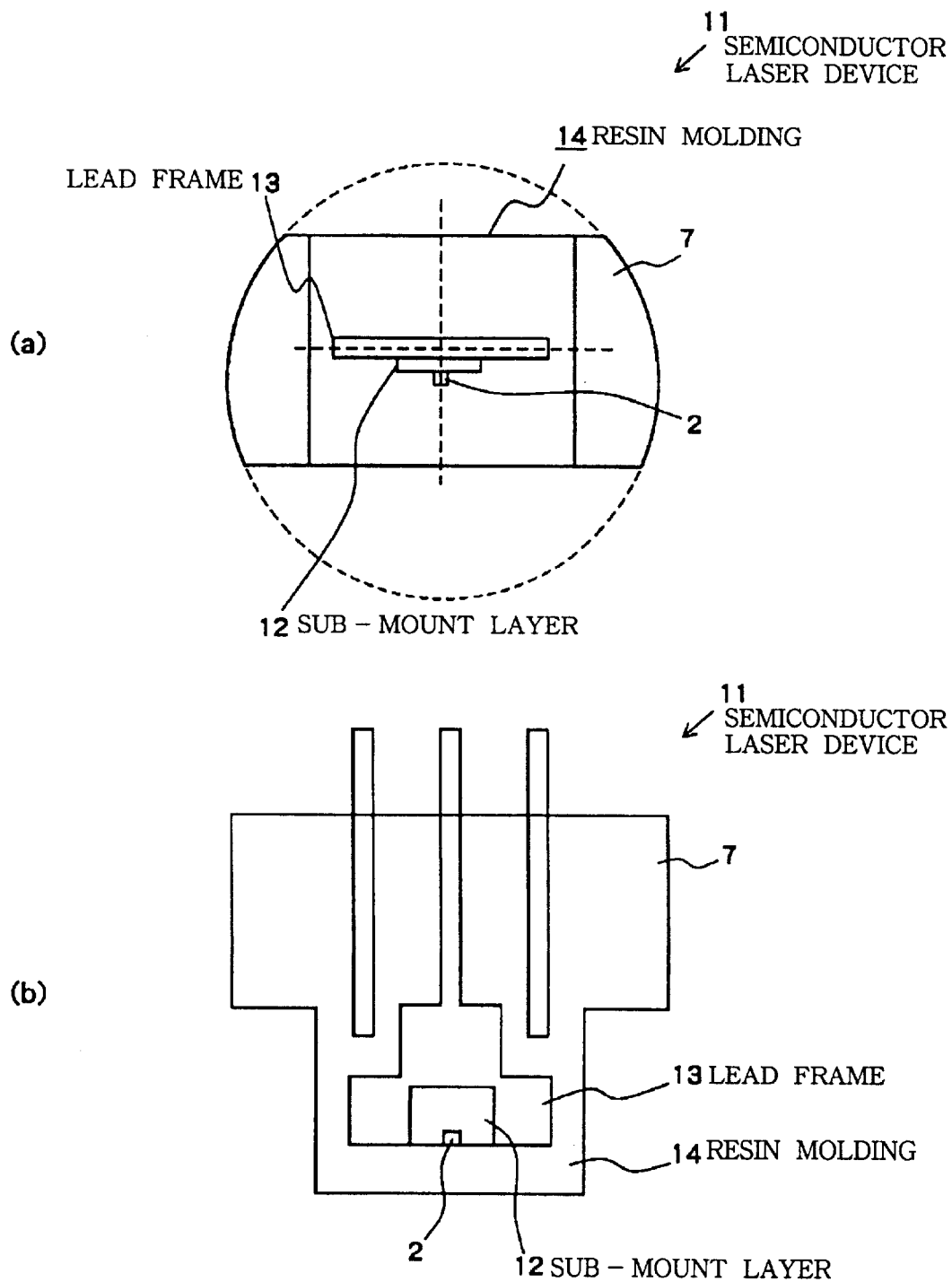
FIGS. 15a–15b are a two-view diagram of the structure of a conventional resin molding type of semiconductor laser device.
Figure 16:
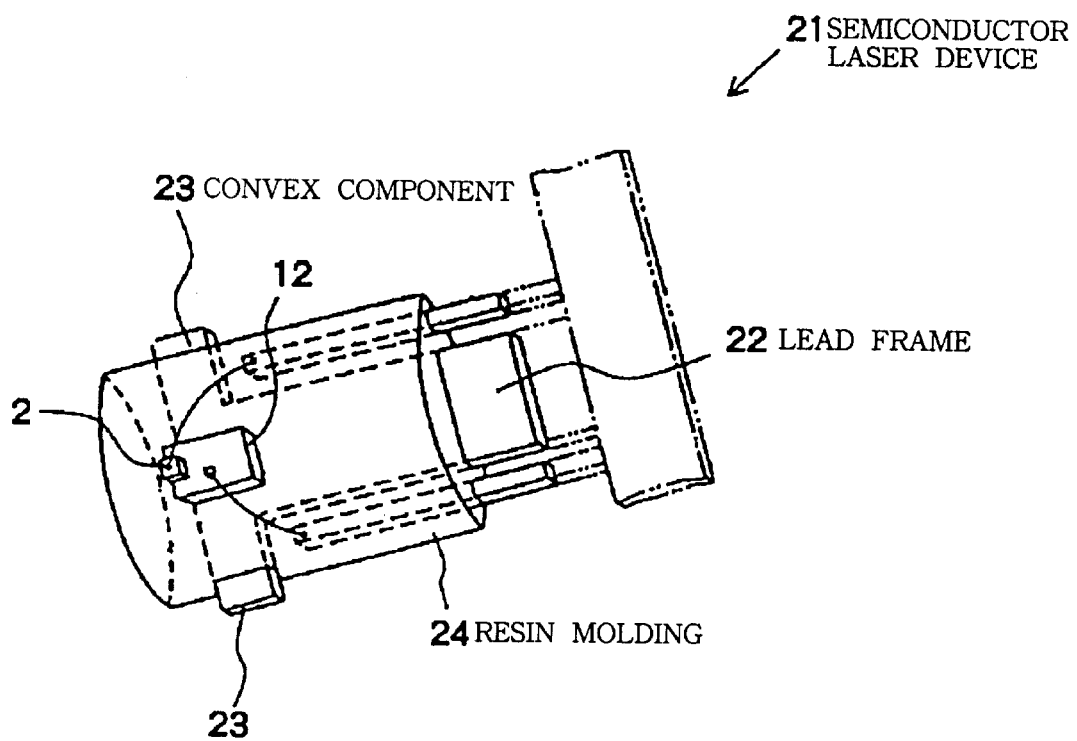
FIG. 16 is an oblique view of the structure of another conventional resin molding type of semiconductor laser device.

Also, with the semiconductor laser device 31 in the above embodiment, the resin cap 42 was formed as a simple L shape and was joined to the box-shaped portion of the resin molding 36, but it is also possible to mold a resin cap 72 and a resin molding 73 in shapes such that the above-mentioned box-like portion is diagonally truncated, and then integrally join these at the diagonal location, as with the semiconductor laser device 71 shown in FIG. 12. With this structure, there is a decrease in productivity because of the more complicated shape of the resin cap 72, but deformation of the resin can 72 as a result of changes over time, for example, can be prevented, and this allows the durability and reliability of the semiconductor laser device 71 to be improved.

It is thus apparent that the present invention is not limited to the above embodiments but may be changed and modified without departing from the scope and spirit of the invention.

Finally, the present application claims the priority of Japanese Patent Application No. Hei9-005489 filed Jan. 16, 1997, which is herein incorporated by reference.

What is claimed is:

1. A semiconductor laser device comprising:
   a lead frame;
   a resin molding provided for sealing a part of said lead frame and including a main body and flange portion having opposite end faces, said resin molding being formed into such a shape that said flange portion protrudes outwardly from a periphery of said main body;
   a laser chip having an optical axis and mounted on a surface of said lead frame for emitting laser light; and
   a heat-radiating fin provided on said lead frame for cooling said laser chip, said heat-radiating fin being embedded within said resin molding except for an exposed surface extending on the side of at least one of said two end faces said flange portion, said exposed surface not extending beyond the outer periphery of said flange portion.

2. A semiconductor laser device as defined in claim 1, wherein said heat-radiating fin is disposed in roughly the same plane as at least one of said two end faces of said flange portion.

3. A semiconductor laser device as defined in claim 1, wherein said lead frame and said heat-radiating fin are molded integrally.

4. A semiconductor laser device as defined in claim 1, wherein said heat-radiating fin comprises a plurality of parts.

5. A semiconductor laser device as defined in claim 1, further comprising a wiring lead frame provided on the side of said lead frame on which said laser chip is mounted; and a convex component provided at a location on the rear end face of said resin molding where said lead frame protrudes.

6. A semiconductor laser device as defined in claim 1, wherein part of the outer peripheral face of said flange portion is formed into a cylinder that is concentric with the optical axis of said laser chip.

7. A semiconductor laser device as defined in claim 6, wherein said flange portion has a flat surface formed parallel to the surface of the lead frame is formed on the outer peripheral face thereof.

8. A semiconductor laser device as defined in claim 6, wherein a pair of flat surfaces parallel to each other and perpendicular to the surface of the lead frame are formed on the outer peripheral face of said flange portion.

9. A semiconductor laser device as defined in claim 1, further including a translucent resin cap covering said laser chip in a sealed state, wherein said resin molding is formed such that said laser chip is exposed.

10. A semiconductor laser device as defined in claim 9, wherein said resin cap is formed in an L shape.

11. A semiconductor laser device as defined in claim 9, wherein said resin cap is formed from a translucent resin.

12. A semiconductor laser device as defined in claim 11, wherein said translucent resin is based on an acrylic or an epoxy.

13. A semiconductor laser device as defined in claim 9, further comprising an anti-reflective film applied to said resin cap at a location where at least laser light is transmitted so as to enhance the transmissivity of the laser light.

* * * * *